(12) United States Patent
Jia et al.

(10) Patent No.: US 10,497,895 B2
(45) Date of Patent: Dec. 3, 2019

(54) ORGANIC LIGHT-EMITTING DISPLAY PANEL AND ORGANIC LIGHT-EMITTING DISPLAY DEVICE

(71) Applicant: SHANGHAI TIANMA AM-OLED CO., LTD., Shanghai (CN)

(72) Inventors: Longchang Jia, Shanghai (CN); Congyi Su, Shanghai (CN); Zhenying Li, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 6 days.

(21) Appl. No.: 15/886,956

(22) Filed: Feb. 2, 2018

(65) Prior Publication Data

US 2019/0067627 A1  Feb. 28, 2019

(30) Foreign Application Priority Data

Aug. 29, 2017 (CN) .......................... 2017 1 0755056

(51) Int. Cl.
*H01L 51/52* (2006.01)
*H01L 27/32* (2006.01)
*H01L 51/50* (2006.01)

(52) U.S. Cl.
CPC ...... *H01L 51/5237* (2013.01); *H01L 27/3211* (2013.01); *H01L 27/3241* (2013.01); *H01L 51/5056* (2013.01); *H01L 51/5206* (2013.01); *H01L 51/5221* (2013.01)

(58) Field of Classification Search
CPC .................................................. H01L 51/5237
See application file for complete search history.

(56) References Cited

U.S. PATENT DOCUMENTS

2018/0006090 A1\* 1/2018 Leem ..................... H01L 27/307
2018/0074326 A1\* 3/2018 Lee ...................... H01L 51/5203

FOREIGN PATENT DOCUMENTS

CN   104576959 A    4/2015
CN   106384743 A    2/2017

\* cited by examiner

*Primary Examiner* — Xia L Cross
(74) *Attorney, Agent, or Firm* — Alston & Bird LLP

(57) ABSTRACT

An organic light-emitting display panel including: an array substrate, an organic light-emitting element placed on the array substrate and comprising light-emitting pixels, and an encapsulation layer placed on a side of the organic light-emitting element away from the array substrate; the encapsulation layer comprises a first inorganic encapsulation layer having a thickness 10 nm~100 nm, a first interlayer bonding layer, and a first organic encapsulation layer along a direction away from the array substrate; refractive indexes of the first inorganic encapsulation layer, the first interlayer bonding layer, and the first organic encapsulation layer are n1, n2 and n3, respectively; the refractive index n2 decreases in gradient along a direction from the first inorganic encapsulation layer toward the first organic encapsulation layer, maximum and minimum refractive indexes of the first interlayer bonding layer are n21 and n22, respectively; n21>n1, n22<n3.

16 Claims, 8 Drawing Sheets

ORGANIC LIGHT-EMITTING DISPLAY PANEL AND ORGANIC LIGHT-EMITTING DISPLAY DEVICE

CROSS-REFERENCE TO RELATED APPLICATIONS

The present application claims priority to Chinese Patent Application No. 201710755056.1, filed on Aug. 29, 2017, the content of which is incorporated herein by reference in its entirety.

TECHNICAL FIELD

The present disclosure relates to the field of display technologies and, particularly, relates to an organic light-emitting display panel and a light-emitting display device containing the organic light-emitting display panel.

BACKGROUND

With the development of the display technologies, the making techniques of display panels also tend to be mature. The existing display panel mainly includes organic light-emitting display panel (OLED), liquid crystal display (LCD), plasma display panel (PDP), etc. The organic light-emitting device, as a self-luminous display device, needs no separate light source, and thus can be operated at a low voltage with high quality such as light weight, thinning, wide view angle, high contrast and fast response, and therefore has attracted lots of attention as the next generation display device.

However, the optical display performance of the organic light-emitting display panel needs to be further improved.

SUMMARY

In one aspect, the present disclosure provides an organic light-emitting display panel including an array substrate; an organic light-emitting element placed on the array substrate and including a plurality of light-emitting pixels; and an encapsulation layer placed on a side of the organic light-emitting element away from the array substrate. The encapsulation layer includes, along a direction away from the array substrate, a first inorganic encapsulation layer, a first interlayer bonding layer and a first organic encapsulation layer. A refractive index of the first inorganic encapsulation layer is n1, a refractive index of the first interlayer bonding layer is n2, a refractive index of the first organic encapsulation layer is n3, the refractive index n2 of the first interlayer bonding layer decreases in gradient along a direction from the first inorganic encapsulation layer toward the first organic encapsulation layer, a maximum refractive index of the first interlayer bonding layer is n21, a minimum refractive index of the first interlayer bonding layer is n22, n21>n1, n22<n3, and the first inorganic encapsulation layer has a thickness of 10 nm-100 nm.

In another aspect, the present disclosure provides organic light-emitting display device including the organic light-emitting display panel as described above.

DESCRIPTION OF EMBODIMENTS

Figure 1:
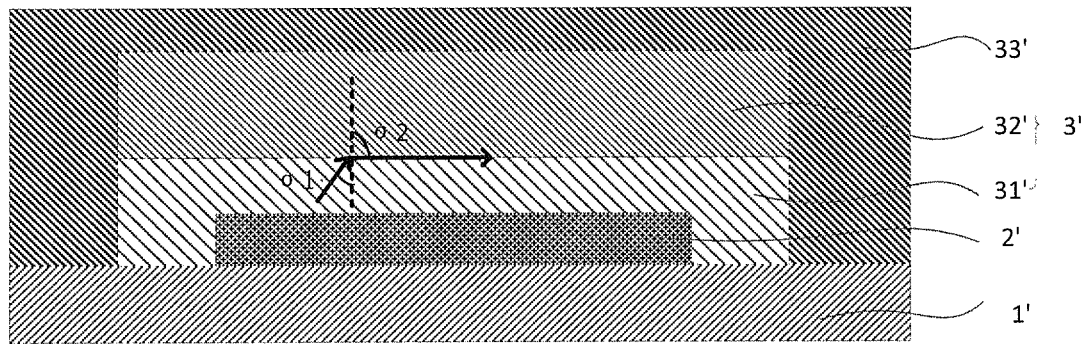
FIG. 1 illustrates a structural schematic diagram of an organic light-emitting display panel in the related art.

In order to better understand the purpose, characteristics and advantages of the present disclosure, the present disclosure is further described by the following embodiments with reference to the accompanying drawings. The exemplary embodiments can be implemented in various manners, but are not limited to the specific embodiments as described below. Those embodiments provided help those skilled in the art fully and comprehensively understand the invention concept of the present disclosure. In the drawings, a same reference sign denotes the same or similar structure, which is not repeated. All the orientation words used in the present disclosure are illustrated with reference to the specific drawing, but can also be varied according to demands, and the variation shall also be included in the protection scope of the present disclosure. The drawings are merely used to schematically show relative position relations, layer thicknesses of some portions are magnified for better understanding, and the layer thickness shown in the drawings do not represent proportion of the real layer thicknesses.

It should be noted the specific details described below are merely used for better understanding the present disclosure. The present disclosure shall not be interpreted to be limited to the specific embodiments as below. If a specific component is mentioned using a certain word in the description and claims, those skilled in the art can understand that hardware manufacturers may use other different words to define the same component. The description and claims will not distinguish the components by difference of their names, but by difference of their functions. The used words "include" or "comprise" throughout the description and claims are open words, which should be interpreted as "including/comprising but not limited to". The embodiments described in the rear part of the description are preferred embodiments of the present disclosure, however, these embodiment are merely for the purpose of illustrating the general principle of the present disclosure but not to limit the present disclosure. The protection scope of the present disclosure shall be defined by the claims attached.

FIG. 1 illustrates a structural schematic diagram of an existing organic light-emitting display panel. As shown in FIG. 1, the organic light-emitting display panel includes an array substrate 1', an organic light-emitting element 2' and an encapsulation layer 3', the encapsulation layer 3' makes the organic light-emitting element 2' be in a closed space so that the moisture and oxygen are prevented from entering the organic light-emitting element and influencing performance of the organic light-emitting element 2'. The encapsulation layer of the related art generally includes a first inorganic encapsulation layer 31', an organic encapsulation layer 32' and a second inorganic encapsulation layer 33'. The atomic layer deposition (ALD) process can deposit compact film with good water barrier effect and is often used to form the first inorganic encapsulation layer, however, the film formed by the ALD process is compact and has smooth surface so that the first inorganic encapsulation layer 31' and the organic encapsulation layer 32' have poor adhesion there between, and the first inorganic encapsulation layer 31' and the organic encapsulation layer 32' easily peel off from the interface there between. Besides, since the first inorganic encapsulation layer 31' has a greater refractive index than the organic encapsulation layer 32', light emitted by the organic light-emitting element with an incident angle of σ1, when passing from the first inorganic encapsulation layer 31' into the encapsulation layer 32', i.e., from an optically denser medium into an optically thinner medium, are easily totally reflected, that is, the reflection angle σ2 is 90°, which adversely influences the light output efficiency.

Figure 2:
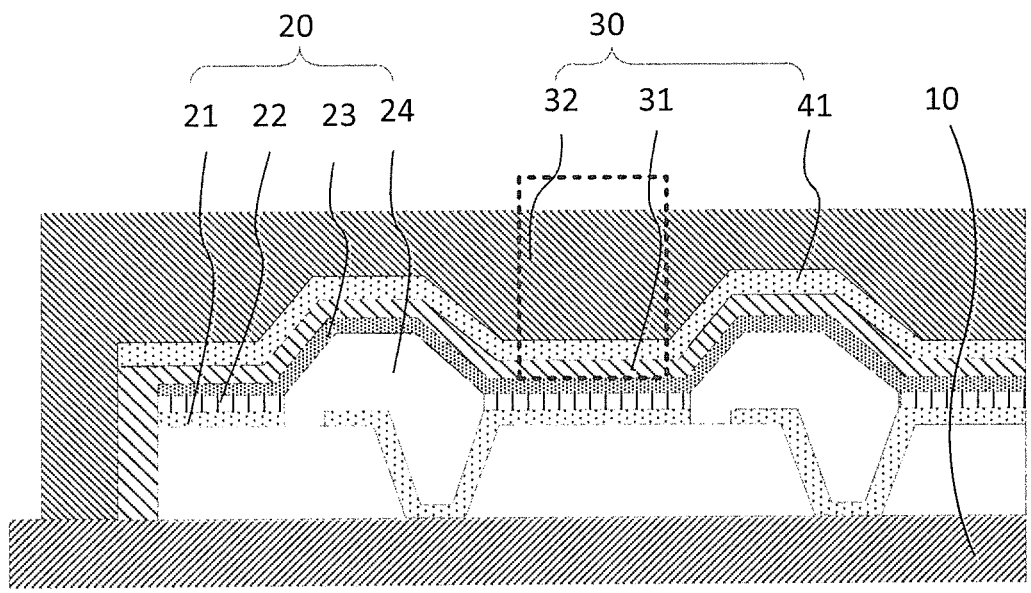
FIG. 2 illustrates a structural schematic diagram of an organic light-emitting display panel according to an embodiment of the present disclosure.
Figure 3:
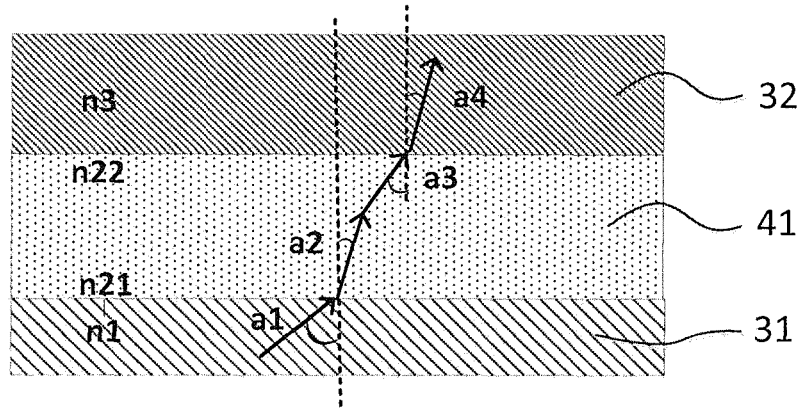
FIG. 3 illustrates an enlarged diagram of the dotted frame area shown in FIG. 2.

FIG. 2 illustrates a structural schematic diagram of an organic light-emitting display panel according to an embodiment of the present disclosure. As shown in FIG. 2, the organic light-emitting display panel includes an array substrate 10, an organic light-emitting element 20 placed on the array substrate 10, and an encapsulation layer 30 placed on a side of the organic light-emitting element away from the array substrate 10. The organic light-emitting element 20 includes a plurality of light-emitting pixels 22. The encapsulation layer 30 includes a first inorganic encapsulation layer 31, a first interlayer bonding layer 41 and a first organic encapsulation layer 32 along a direction away from the array substrate 10. A refractive index of the first inorganic encapsulation layer 31 is n1, a refractive index of the first interlayer bonding layer 41 is n2, a refractive index of the first organic encapsulation layer 32 is n3, the refractive index n2 of the first interlayer bonding layer 41 decreases in gradient along a direction from the first inorganic encapsulation layer 31 toward the first organic encapsulation layer 32, a maximum refractive index of the first interlayer bonding layer 41 is n21, a minimum refractive index of the first interlayer bonding layer 41 is n22, n21>n1, n22<n3. In one embodiment of the present disclosure, the first inorganic encapsulation layer 31 is made by atomic layer deposition with a thickness of 10 nm-100 nm, and the first inorganic encapsulation layer 31 made by atomic layer deposition has a stack structure in an atomic level, so that the first inorganic encapsulation layer 31 is thin and suitable for bending while having good particle covering effect and good water and oxygen barrier effect. Optionally, as shown in FIG. 3, which illustrates an enlarged diagram of a dotted frame area shown in FIG. 2, light emitted from the organic light-emitting element 20 goes through the first inorganic encapsulation layer 31 into the first interlayer bonding layer 41 at an incident angle a1. Since n21 is greater than n1, the situation that the light goes through the first inorganic encapsulation layer into the first interlayer bonding layer belongs to a situation that the light goes from an optically thinner medium into an optically denser medium. Since n21 is greater than n1, a1 will be greater than a2 according to the refractive index formula:

$$\frac{n1}{n21} = \frac{\sin a2}{\sin a1},$$

and total reflection won't occur, which can effectively prevent the total reflection phenomenon if the light emitted by the organic light-emitting element goes through the first inorganic encapsulation layer with a higher refractive index directly into the first organic encapsulation layer with a lower refractive index. Similarly, when the light is travelling in the first interlayer bonding layer 41, since the refractive index of the first interlayer bonding layer 41 decreases in gradient along a direction from the first inorganic encapsulation layer 31 to the first organic encapsulation layer 32, assuming that the total reflection occurs when the decrease amplitude of the refractive index of the first interlayer bonding layer 41 from the first inorganic encapsulation layer 31 to the first organic encapsulation layer 32 is Δn, it can be known from a formula $$\frac{n2}{n2 + \Delta n} = \frac{\sin 90°}{\sin a1}$$

that Δn=n2(1−sin a2). Therefore, as long as the refractive index of the first interlayer bonding layer 41 decreases in gradient along the direction from the first inorganic encapsulation layer 31 toward the first organic encapsulation layer 32 and the decease amplitude is smaller than n2(1−sin a2), the total reflection of the light in the first interlayer bonding layer 41 can be prevented, thereby improving light output efficiency. Similarly, when the light enters into the first organic encapsulation layer at an incident angle a3 from the first interlayer bonding layer, it can be known from a formula $$\frac{n3}{n22} = \frac{\sin a3}{\sin a4}$$

and n22<n3 that a3>a4, so that the total reflection of the light when going through the first interlayer bonding layer 41 into the first organic encapsulation layer can be avoided. The atomic layer deposition process includes steps of alternatively pulsing a gaseous precursor into a reactor and forming a deposition film on a substrate by absorption and reaction, and the formed deposition film is a stack structure in an atomic layer level, which is thin while having good compactness and therefore has good water-oxygen barrier effect. Thus, the first inorganic encapsulation layer made by the atomic layer deposition process in the embodiment can have good water-oxygen barrier effect. The first interlayer bonding layer placed between the first inorganic encapsulation layer 31 and the first organic encapsulation layer 32 can effectively improve the bonding performance of the first inorganic encapsulation layer and the first organic encapsulation layer, thereby improving the encapsulation effect of the organic light-emitting display panel.

Optionally, the first inorganic encapsulation layer 31 can contain a material selected from metal oxide and non-metal oxide, for example, the first inorganic encapsulation layer 31 contains any one of aluminum oxide, titanium oxide and silicon oxide. The first inorganic encapsulation layer 31 may further contain a material selected from a group consisting of nitride, oxynitride and combinations thereof. For example, the first inorganic encapsulation layer 31 further contains a material selected from a group consisting of silicon nitride, silicon oxynitride and combinations thereof. When the first inorganic encapsulation layer 31 is made of aluminum oxide, trimethyl aluminum ($Al(CH_3)_3$) can be used as the precursor. For example, the aluminum oxide can be made using the atomic layer deposition process with the following steps.

First, a first precursor (trimethyl aluminum ($Al(CH_3)_3$)) is inputted and heated into into a gaseous state, then enters into a reaction chamber of an atomic layer deposition system in which the first precursor in the gaseous state is deposited and absorbed on a substrate.

Second, the reaction chamber of the atomic layer deposition system is purged with an inert gas (purge gas such as high-purity nitrogen and argon), thereby ejecting unabsorbed trimethyl aluminum ($Al(CH_3)_3$) precursor and by-product out of the reaction chamber.

Third, a reaction gas is inputted into the reaction chamber of the atomic layer deposition system to form the first inorganic encapsulation layer 31, and the reaction gas is used as an oxidation source and can be for example oxygen or water vapor.

Finally, the reaction chamber of the atomic layer deposition system is purged with an inert gas and the un-reacted gas and by-product are expelled out of the reaction chamber, so that deposition of one layer of aluminum oxide is finished so far. According to the above steps, a plurality of layers of aluminum oxide can be deposited, depending on demands. Optionally, when the first inorganic encapsulation layer 31 is made of titanium oxide, titanium tetrachloride can be used as the precursor. Both the layer of aluminum oxide and the layer of titanium oxide made by the atomic layer deposition process have a compact layer structure and can well cover the particles and barrier water and gas. In one embodiment, different precursors can be used alternatively so that a composite stacked by different atomic layers is formed as the first inorganic encapsulation layer 31.

Optionally, the first interlayer bonding layer 41 can contain silicon oxynitride, and an oxygen concentration of the silicon oxynitride in the first interlayer bonding layer 41 increases in gradient along the direction from the first inorganic encapsulation layer 31 toward the first organic encapsulation layer 32. It is found during preparing the silicon oxynitride that silicon oxynitrides with different nitrogen/oxygen contents are obtained by adjusting the content of $N_2O$ (oxygen source for silicon oxynitride) and the content of $NH_3$ (nitrogen source for silicon oxynitride), and the refractive indexes of these silicon oxynitrides are tested and shown in Table 1. It can be seen from Table 1 that the refractive index of the silicon oxynitride can be adjusted by adjusting its oxygen content and the greater the oxygen content of the silicon oxynitride, the smaller its refractive index.

TABLE 1

Refractive indexes of silicon oxynitrides with different nitrogen/oxygen contents

| Nitrogen-oxygen atom ratio in silicon oxynitride | Refractive index |
| --- | --- |
| SiO | 1.47 |
| SiON | 1.55 |
| $SiON_2$ | 1.8 |
| SiN | 2.3 |

The refractive index of silicon oxide is about 1.47 and the refractive index of silicon nitride is about 2.3. In one embodiment of the present disclosure, the refractive index of silicon oxynitride is controlled in a range of 1.5-2.0 by controlling the content of oxygen element in the silicon oxynitride. Optionally, in one embodiment, the content of the oxygen element is controlled to increase in gradient along a direction from the first inorganic encapsulation layer 31 toward the first organic encapsulation layer 32, so that the refractive index of the silicon oxynitride decreases in gradient along the direction from the first inorganic encapsulation layer 31 toward the first organic encapsulation layer 32, that is, the refractive index of the first interlayer bonding layer 41 decreases in gradient from 2.0 to 1.5. Since the refractive index of aluminum oxide is about 1.765 and the refractive index of a portion of the first interlayer bonding layer 41 close to the first inorganic encapsulation layer 31 is 2.0, the situation that the light emitted by the organic light-emitting element 20 goes from the first inorganic encapsulation layer 31 into the first interlayer bonding layer 41 is a situation that the light goes from an optically thinner medium into an optically denser medium, so that total reflection of the light emitted by the organic light-emitting element 20 can be prevented when the light directly enters into the first interlayer bonding layer 41 from the first inorganic encapsulation layer 31, thereby improving the light output efficiency. The refractive index of a portion of the first interlayer bonding layer 41 close to the first organic encapsulation layer 32 is 1.5 and the first organic encapsulation layer 32 is generally made of organics with a refractive index of about 1.5, so that total reflection of the light emitted by the organic light-emitting element 20 can be avoided when the light directly enters into the first organic encapsulation layer 32 from the first interlayer bonding layer 41.

Table 2 shows comparison experiments about peeling of different encapsulation structures. As shown in Table 2, three encapsulation structures, i.e., structure I, structure II and structure III, are made. Structure I is formed by stacking a first inorganic encapsulation layer and a first organic encapsulation layer, the first inorganic encapsulation layer is a silicon nitride film with a thickness of 1 μm made by the chemical vapor deposition process, there was no peeling between the first inorganic encapsulation layer and the first organic encapsulation layer in the formed structure I, and a water-oxygen permeability of structure I is $1.2\times10^{-3}$(g/[m²-day]). Structure II is a stack structure of a first inorganic encapsulation layer/a first organic encapsulation layer, the first inorganic encapsulation layer is an aluminum oxide film with a thickness of 30 nm made by the atomic layer deposition process, and peeling occurs between the first inorganic encapsulation layer and the first organic encapsulation layer in structure II. Structure III is a stacked structure of a first inorganic encapsulation layer/a first interlayer bonding layer/a first organic encapsulation layer, the first inorganic encapsulation layer is an aluminum oxide film with a thickness of 30 nm made by the atomic layer deposition process, the first interlayer bonding layer is a silicon oxynitride film made by chemical vapor deposition, the nitrogen-oxygen atom ratio of the silicon oxynitride is 1:1, there was no peeling between the first interlayer bonding layer and the first inorganic encapsulation layer or between the first interlayer bonding layer and the first organic encapsulation layer in structure III, and water-oxygen permeability of structure III is about $2.6\times10^{-4}$(g/[m²-day]). The silicon oxynitride in structure III can be made by chemical vapor deposition, and the silicon oxynitride made by the chemical vapor deposition has good interface contact performance with both the first inorganic encapsulation layer and the first organic encapsulation layer. In one embodiment of the present disclosure, the first interlayer bonding layer is made between the first inorganic encapsulation layer and the first organic encapsulation layer, the first inorganic encapsulation layer is made by the atomic layer deposition process and has good water and oxygen barrier effect, the first interlayer bonding layer can effectively improve the interface bonding performance between the first inorganic encapsulation layer and the first organic encapsulation layer and prevent interface peeling between the first inorganic encapsulation layer and the first organic encapsulation layer, the first inorganic encapsulation layer 31 with a thickness of 10 nm~100 nm made by ALD has good particle covering effect and good water and oxygen barrier effect, reduces the thickness of the encapsulation layer, and improves the bending performance. In addition, when the first interlayer bonding layer is made of silicon oxynitride, the oxygen concentration of the silicon oxynitride is controlled to increase in gradient along a direction from the first inorganic encapsulation layer toward the first organic encapsulation layer, so that the refractive index of the silicon oxynitride decreases in gradient along the direction from the first inorganic encapsulation layer toward the first organic encapsulation layer, which prevents the total reflection of the light emitted by the organic light-emitting element when the light directly enters into the first organic encapsulation layer from the first inorganic encapsulation layer, thereby proving light output efficiency. Further, when the first interlayer bonding layer is made of silicon oxynitride, the oxygen concentration of the silicon oxynitride is controlled to increase in gradient along a direction from the first inorganic encapsulation layer toward the first organic encapsulation layer, that is, the silicon oxynitride close to the first organic encapsulation layer has a relative greater silicon content and has similar property with silicon nitride. It can be known from structure I that silicon nitride and the first organic encapsulation layer have good interface contact performance there between and no peeling occurs.

TABLE 2

Comparison experiments about peeling of different encapsulation structures

| NO. | Encapsulation structure | First inorganic encapsulation layer | Material of first inorganic encapsulation layer | Material of first interlayer bonding layer | Thickness of first inorganic encapsulation layer | Peeling or not |
|---|---|---|---|---|---|---|
| Structure I | the first inorganic encapsulation layer/ the first organic encapsulation layer | Chemical vapor deposition | silicon nitride | null | 1 μm | No peeling |
| Structure II | the first inorganic encapsulation layer/ the first organic encapsulation layer | Atomic layer deposition | aluminum oxide | null | 30 nm | peeling |
| Structure III | the first inorganic encapsulation layer/ the first interlayer bonding layer/ the first organic encapsulation layer | Atomic layer deposition | aluminum oxide | silicon oxynitride | 30 nm | No peeling |

The array substrate 10 can optionally include a flexible substrate, and the material of the flexible substrate is not limited in the present disclosure. Optionally, the material of the flexible substrate can be organic polymer, for example, the organic polymer may be one of polyimide (PI), polyamide (PA), polycarbonate (PC), poly(oxyphenylene sulfone) (PES), polyethylene terephthalate (PET), polyethylene naphthalate (PEN), polymethyl methacrylate (PMMA) and cycloolefin copolymer (COC).

The array substrate 10 may further include a thin film transistor layer (not shown in the drawings), a plurality of data lines and a plurality of scan lines (not shown in the drawings) necessary for realizing display. The thin film transistor layer at least includes an active layer, a source electrode, a drain electrode, a gate electrode, and an insulation layer. The drain electrode of the thin film transistor layer is electrically connected with an anode 21 of the organic light-emitting element 20. The plurality of data lines and the plurality of scan lines intersect with one another. The data lines are electrically connected to the source electrode of the thin film transistor layer, and the scan lines are electrically connected to the gate electrode of the thin film transistor layer. When working, the scan lines control on-off state of the subpixels by the gate electrode of the thin film transistor layer, and the data lines are electrically connected with the anode 21 of the organic light-emitting element 20 by the source electrode of the thin film transistor layer, provide data signal for the subpixels and control display of the subpixels when the thin film transistors respectively corresponding to the sub-pixels are turned on. The thin film transistor layer can be structured as in the related art, which is not repeated herein.

In one embodiment, the organic light-emitting element 20 is placed in a display area of the array substrate 10 and includes an anode 21, a plurality of light-emitting pixels 22 and a cathode 23 placed on a side of the array substrate 10 along a direction from the array substrate 10 toward the encapsulation layer 30. The organic light-emitting element 20 may further include one or more of a hole injection layer, a hole transportation layer, an electron blocking layer, a hole blocking layer, an electron transportation layer and an electron injection layer. The light-emitting pixels 20 may further include a pixel defining layer 24. Adjacent light-emitting pixels 22 are spaced from one another by the pixel defining layer 24 to form a plurality of light-emitting pixels. The plurality of light-emitting pixels may include a red light-emitting pixel, a green light-emitting pixel or a blue light-emitting pixel. The hole injection layer and/or the hole transportation layer can be placed between the anode 21 and the light-emitting pixels 22. The electron injection layer and/or the electron transportation layer can be placed between the cathode 23 and the light-emitting pixels 22. The hole injection layer, the hole transportation layer, the electron transportation layer and the electron injection layer can be formed all over the display area of the array substrate 10. The organic light-emitting element 20 can be structured with a material in the related art, which is not repeated herein.

Figure 4A:
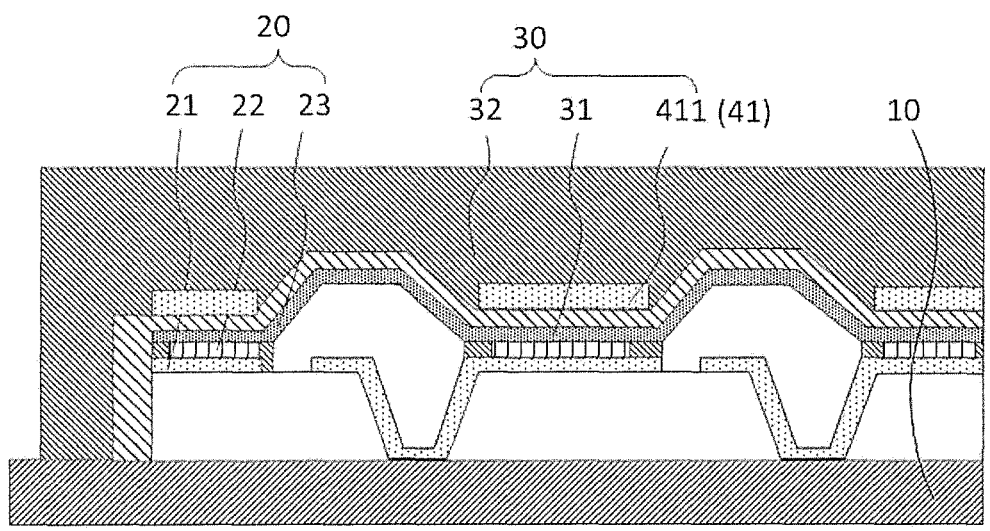
FIG. 4a illustrates a structural schematic diagram of another organic light-emitting display panel according to an embodiment of the present disclosure.

Optionally, FIG. 4a illustrates a structural schematic diagram of another organic light-emitting display panel according to an embodiment of the present disclosure. The difference between the embodiment shown in FIG. 4a and the embodiment shown in FIG. 2 include that the first interlayer bonding layer 41 shown in FIG. 4a includes a plurality of island-shaped first interlayer bonding sub-layers 411, and the shapes of these island-shaped first interlayer bonding sub-layers 411 when viewed from top may be quadrangles, circles, triangles, polygons or any combinations thereof. Optionally, adjacent island-shaped first interlayer bonding sub-layers 411 are spaced from one another. In one embodiment, the island-shaped first interlayer bonding sub-layers 411 are provided and the first organic encapsulation layer 32 is effectively filled in the gap between adjacent island-shaped first interlayer bonding sub-layers 411, so that the island-shaped first interlayer bonding sub-layers 411 won't occupy additional layer thickness while effectively improving the bonding performance between the first inorganic encapsulation layer 31 and the first organic encapsulation layer 32 and preventing the total reflection of the light when directly going into the first organic encapsulation layer 32 from the first inorganic encapsulation layer 31, thereby improving light output efficiency. Optionally, the island-shaped first interlayer bonding sub-layers are placed corresponding to the light-emitting pixels. The island-shaped first interlayer bonding sub-layers 411 are placed corresponding to the light-emitting pixels 22, and projections of the light-emitting pixels 22 on the array substrate are located in projections of the island-shaped first interlayer bonding sub-layers on the array substrate.

Figure 4B:
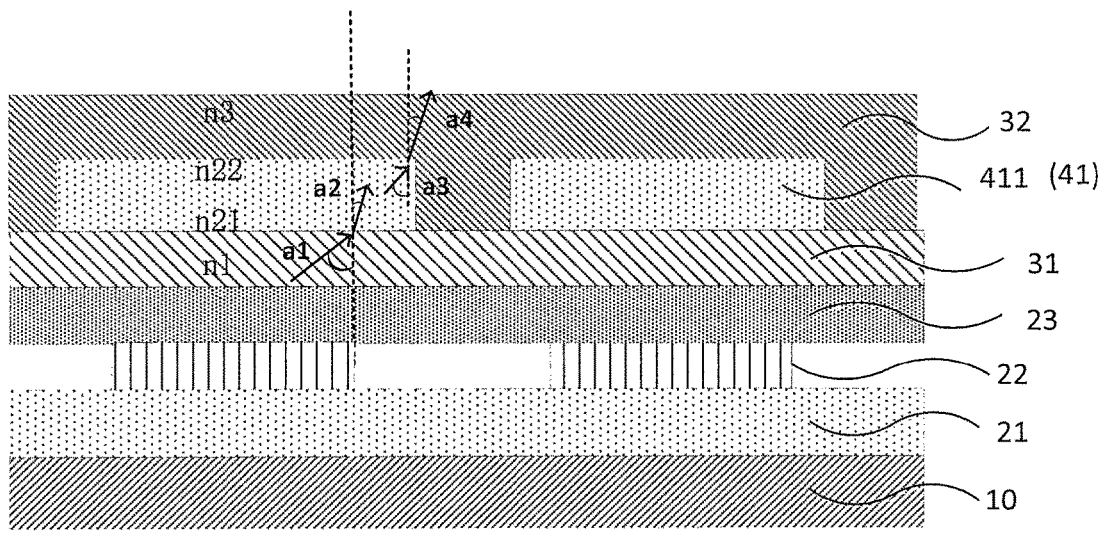
FIG. 4b illustrates a structural schematic diagram showing a solution in which an projection of a light-emitting pixel on an array substrate is located in an projection of an island-shaped first interlayer bonding sub-layer on the array substrate.
Figure 4C:
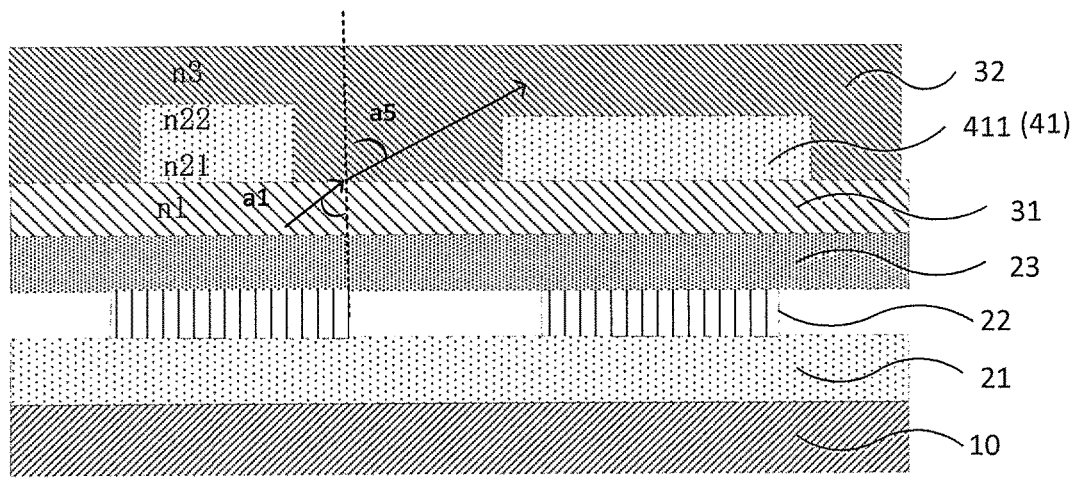
FIG. 4c illustrates a structural schematic diagram showing a solution in which an projection of an island-shaped first interlayer bonding sub-layer on an array substrate is located in an projection of a light-emitting pixel on the array substrate.

In the following, the embodiments of the present disclosure will illustrate why the arrangement that projections of the light-emitting pixels 22 on the array substrate are located in projections of the island-shaped first interlayer bonding sub-layers on the array substrate can improve light output efficiency and avoid color mixing. Please refer to FIG. 4b and FIG. 4c. FIG. 4b illustrates a structural schematic diagram showing a solution in which a projection of a light-emitting pixel on an array substrate is located in an projection of an island-shaped first interlayer bonding sub-layer on the array substrate is located, and FIG. 4c illustrates a structural schematic diagram showing a solution in which an projection of an island-shaped first interlayer bonding sub-layer on an array substrate is located in an area where an projection of a light-emitting pixel on the array substrate is located. As shown in FIG. 4b, the projection of the light-emitting pixel on the array substrate is located in the projection of the island-shaped first interlayer bonding sub-layer on the array substrate so that light emitted from the light-emitting pixel needs to pass through the island-shaped first interlayer bonding sub-layer. The refractive index of the island-shaped first interlayer bonding sub-layer decreases in gradient along a direction from the first inorganic encapsulation layer 31 toward the first organic encapsulation layer 32, the maximum refractive index n21 of the first interlayer bonding layer 41 is greater than the refractive index n1 of the first inorganic encapsulation layer, and the minimum refractive index n22 of the first interlayer bonding layer 41 is smaller than the refractive index n3 of the first organic encapsulation layer, such that a2<a1 and a4<a3, that is, the light gathers toward the normal direction, thereby preventing light emitted from one light-emitting pixel from entering into an emission area of an adjacent light-emitting pixel and thus avoiding color mixing. As shown in FIG. 4c, the projection of the island-shaped first interlayer bonding sub-layer on the array substrate is located in the projection of the light-emitting pixel on the array substrate and no island-shaped first interlayer bonding sub-layer is placed corresponding to the edge of the light-emitting pixel, the light directly enters into the first organic encapsulation layer after passing through the first inorganic encapsulation layer. Since the refractive index of the first organic encapsulation layer is smaller than the refractive index of the first inorganic encapsulation layer, a5>a1 and the light will be scattered, such that the light emitted from the light-emitting pixel enters into its adjacent light-emitting pixel, causing color mixing.

Figure 5:
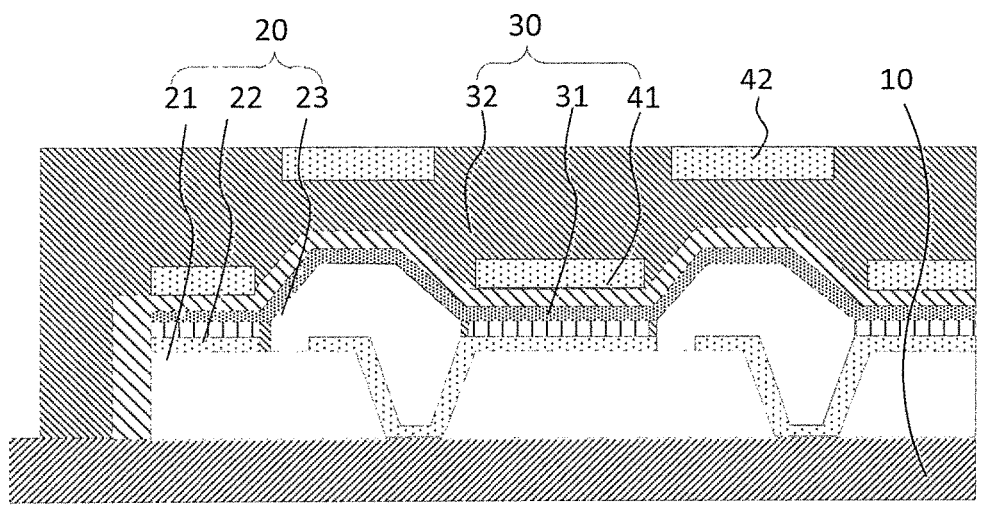
FIG. 5 illustrates a structural schematic diagram of still another organic light-emitting display panel according to an embodiment of the present disclosure.

Optionally, FIG. 5 illustrates a structural schematic diagram of still another organic light-emitting display panel according to an embodiment of the present disclosure. The same features of the embodiment shown in FIG. 5 as the above embodiment are not repeated herein. In the embodiment shown in FIG. 5, the organic light-emitting display panel further includes a second interlayer bonding layer 42, a groove is defined at a side of the first organic encapsulation layer away from the organic light-emitting element, and the second interlayer bonding layer 42 is filled in the groove. In addition, the second interlayer bonding layer 42 may contain silicon oxynitride. The first organic encapsulation layer can be made by ink jet printing, the groove is formed in the corresponding area while the first organic encapsulation layer is formed by ink jet printing, and then the second interlayer bonding layer is filled into the groove. Optionally, a projection of the groove on the array substrate 10 does not overlap with projections of the first interlayer bonding sub-layers 41 on the array substrate 10. In one embodiment, the projection of the groove on the array substrate 10 does not overlap with the projections of the first interlayer bonding sub-layers 41 on the array substrate 10, that is, the projection of the second interlayer bonding layer on the array substrate 10 does not overlap with the projections of the first interlayer bonding sub-layers on the array substrate 10, so that the light output efficiency won't be influenced due to refraction and reflection of the light when transmitting a lot more layers. When the projection of the second interlayer bonding layer on the array substrate 10 does not overlap with the projection of the first interlayer bonding sub-layer on the array substrate 10, light emitted from the light-emitting pixels will go through the same number of layers, so that light output efficiencies respectively corresponding to the light-emitting pixels will be more uniform and light will be emitted more uniformly all over the whole display panel.

Figure 6:
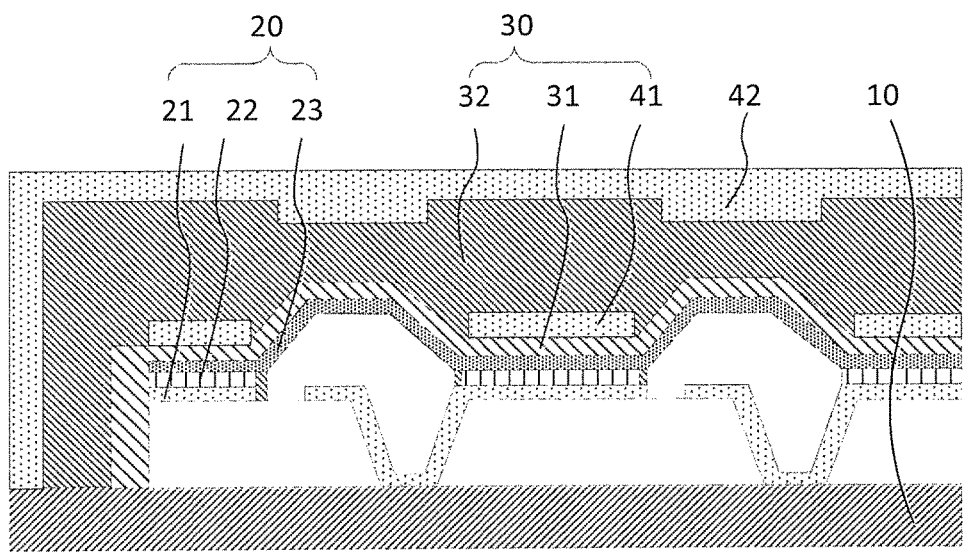
FIG. 6 illustrates a structural schematic diagram of still another organic light-emitting display panel according to an embodiment of the present disclosure.

Optionally, FIG. 6 illustrates a structural schematic diagram of still another organic light-emitting display panel according to an embodiment of the present disclosure. The same features of the embodiment shown in FIG. 6 as the above embodiment are not repeated herein. In the embodiment shown in FIG. 6, the second interlayer bonding layer 42 fills the groove and covers the first organic encapsulation layer 32. The second interlayer bonding layer 42 can be made of silicon oxynitride. The nature of silicon oxynitride is between silicon nitride and silicon oxide and has a certain water oxygen barrier effect, and thus can improve the encapsulation effect. Optionally, the refractive index of the second interlayer bonding layer 42 is n4, the refractive index of the first organic encapsulation layer 32 is n3, and n4>n3, so that the situation that the light travels from the first organic encapsulation layer 32 into the second interlayer bonding layer belongs to a situation that the light travels from an optically thinner medium into an optically denser medium, which can reduce the total reflection of the light when the light enters into the second interlayer bonding layer from the first organic encapsulation layer while improving the encapsulation effect of the second interlayer bonding layer, thereby improving light output efficiency. The oxygen concentration of the silicon oxynitride in the second interlayer bonding layer 42 increases in gradient along a direction from the first inorganic encapsulation layer 31 toward the second interlayer bonding layer 32 so that the emergent angle of the light increases in gradient when travelling in the second interlayer bonding layer, thereby improving the view angle while improving the encapsulation effect.

Figure 7:
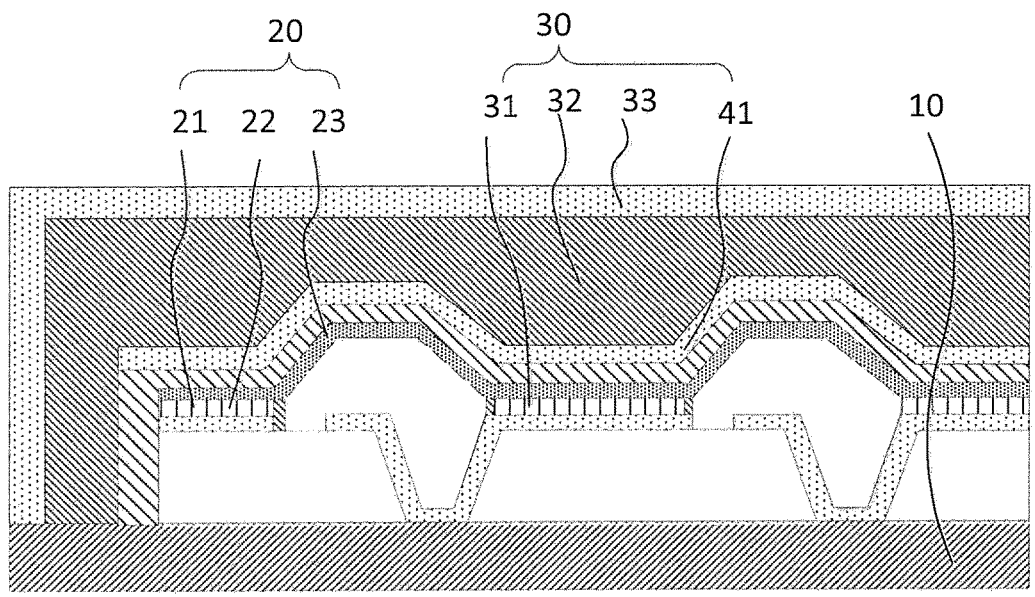
FIG. 7 illustrates a structural schematic diagram of still another organic light-emitting display panel according to an embodiment of the present disclosure.

Optionally, FIG. 7 illustrates a structural schematic diagram of still another organic light-emitting display panel according to an embodiment of the present disclosure. The same features of the embodiment shown in FIG. 7 as the above embodiment are not repeated herein. In the embodiment shown in FIG. 7, the organic light-emitting display panel further includes a second inorganic encapsulation layer 33. The second inorganic encapsulation layer 33 covers the first organic encapsulation layer 32. The second inorganic encapsulation layer can be made of: metal oxide, such as aluminum oxide, titanium oxide, tin oxide and so on; non-metal oxide, nitride, oxynitride, etc., for example silicon oxide; silicon nitride, silicon oxynitride, silicon oxycarbide, etc., or any combination thereof. In the present embodiment, the feature that the second inorganic encapsulation layer 33 covers the first organic encapsulation layer 32 can further improve the barrier effect of the organic light-emitting display panel against water and oxygen and improve the encapsulation performance. Optionally, the refractive index of the second inorganic encapsulation layer 33 is greater than the refractive index of the first organic encapsulation layer 32 so that the total reflection of the light is reduced when the light enters into the second inorganic encapsulation layer from the first organic encapsulation layer 32 and the light output efficiency is improved. Optionally, the second inorganic encapsulation layer can be made by chemical vapor deposition (CVD) or plasma-enhanced chemical vapor deposition (PECVD), and the second inorganic encapsulation layer formed by CVD or PECVD has good interface contact performance with the first organic encapsulation layer.

Figure 8:
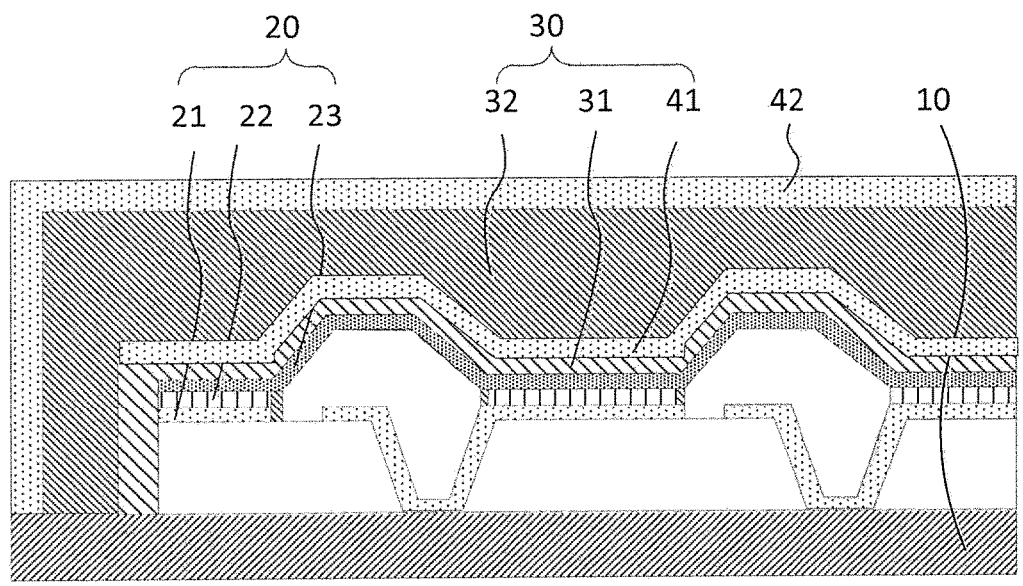
FIG. 8 illustrates a structural schematic diagram of still another organic light-emitting display panel according to an embodiment of the present disclosure.
Figure 9:
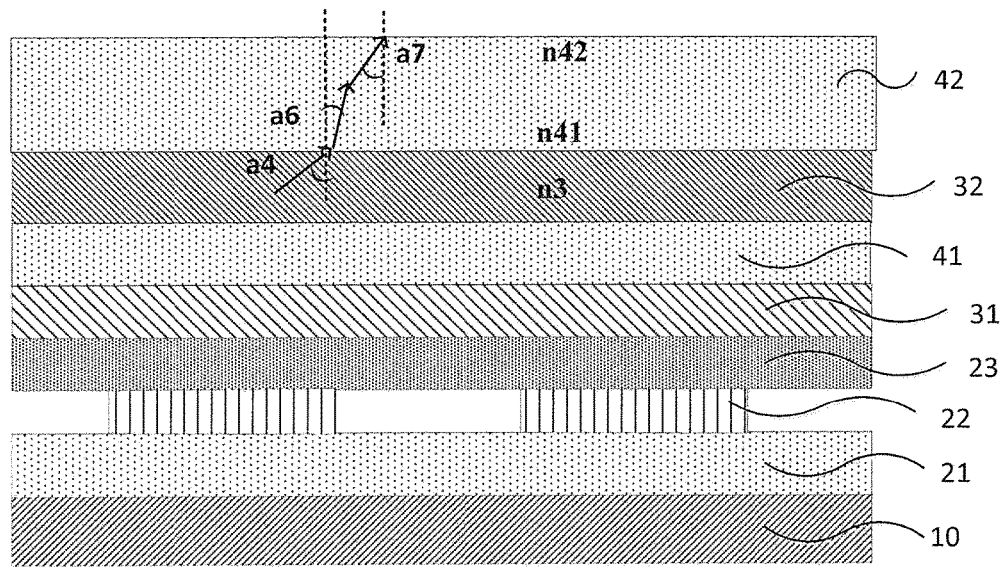
FIG. 9 illustrates a schematic diagram of an optical path of light passing from a first organic encapsulation layer into a second interlayer bonding layer.

FIG. 8 illustrates a structural schematic diagram of still another organic light-emitting display panel according to an embodiment of the present disclosure. The same features of the embodiment shown in FIG. 8 as the above embodiment are not repeated herein. In the embodiment shown in FIG. 8, the display panel further includes a second interlayer bonding layer 42, and the second interlayer bonding layer 42 covers the first organic encapsulation layer 32. In the present embodiment, the arrangement that the second interlayer bonding layer 42 covers the first organic encapsulation layer 32 can further improve the barrier effect of the organic light-emitting display panel against oxygen and moisture and improve the encapsulation effect. Optionally, the refractive index of the second interlayer bonding layer 42 is greater than the refractive index of the first organic encapsulation layer so that the total reflection of the light is reduced when the light enters into the second interlayer bonding layer 42 from the first organic encapsulation layer 32 and thus the light output efficiency is improved. Optionally, the second interlayer bonding layer can be made of silicon oxynitride, and the oxygen concentration of the silicon oxynitride increases in gradient along a direction from the first inorganic encapsulation layer 31 toward the second interlayer bonding layer 32 and the refractive index of silicon oxynitride decreases in gradient along that direction. The maximum refractive index of the second interlayer bonding layer 42 is n41, the minimum refractive index of the second interlayer bonding layer 42 is n42, the refractive index of the first organic encapsulation layer 32 is n3, and n41>n3. FIG. 9 illustrates a schematic diagram of an optical path of light passing from a first organic encapsulation layer into a second interlayer bonding layer. It can be seen from FIG. 9 that the refractive index of the second interlayer bonding layer 42 is greater than the refractive index of the first organic encapsulation layer so that a6 is smaller than a4, which avoids the total reflection of the light when the light enters into the second interlayer bonding layer from the first organic encapsulation layer; the refractive index of the silicon oxynitride decreases in gradient along a direction from the first inorganic encapsulation layer 31 toward the second interlayer bonding layer 32 so that a7 is greater than a6 and the output light is more divergent, thereby improving the view angel. As mentioned above, the total reflection of the light in the second interlayer bonding layer can be avoided by controlling the change gradient of the refractive index.

Figure 10:
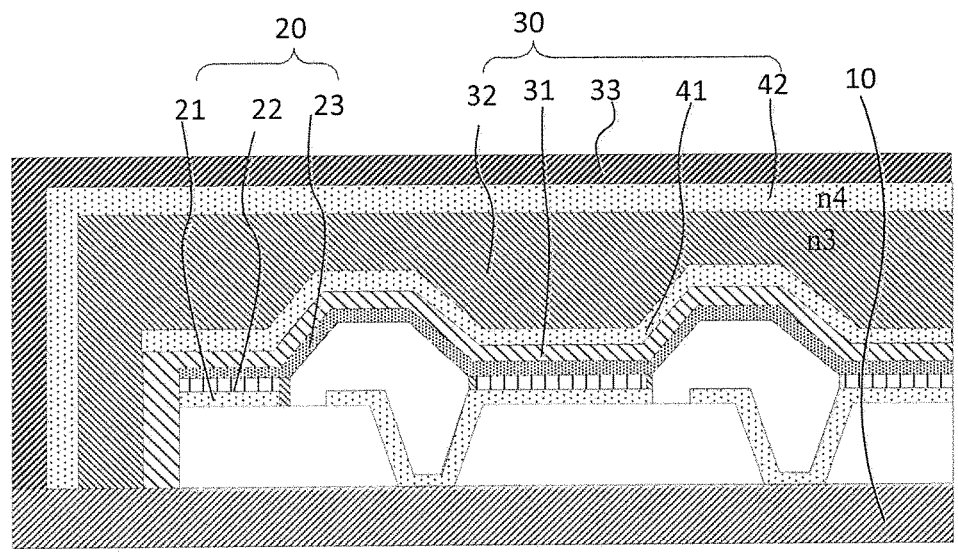
FIG. 10 illustrates a structural schematic diagram of still another organic light-emitting display panel according to an embodiment of the present disclosure.

Optionally, FIG. 10 illustrates a structural schematic diagram of still another organic light-emitting display panel according to an embodiment of the present disclosure. In the embodiment shown in FIG. 10, the organic light-emitting display panel further includes a second interlayer bonding layer 42 placed between the second inorganic encapsulation layer 33 and the first organic encapsulation layer 32. Optionally, the refractive index of the second interlayer bonding layer 42 is n4, the refractive index of the first organic encapsulation layer 32 is n3, and n4>n3, so that the output efficiency of the light when entering into the second interlayer bonding layer from the first organic encapsulation layer is improved. Optionally, the refractive index of the second interlayer bonding layer 42 decreases along a direction from the first inorganic encapsulation layer 31 toward the first organic encapsulation layer 32, the maximum refractive index of the second interlayer bonding layer 42 is n41, the minimum refractive index of the second interlayer bonding layer 42 is n42, and n41>n3, which improves the view angel while improving the output efficiency of the light when entering into the second interlayer bonding layer from the first organic encapsulation layer.

Figure 11:
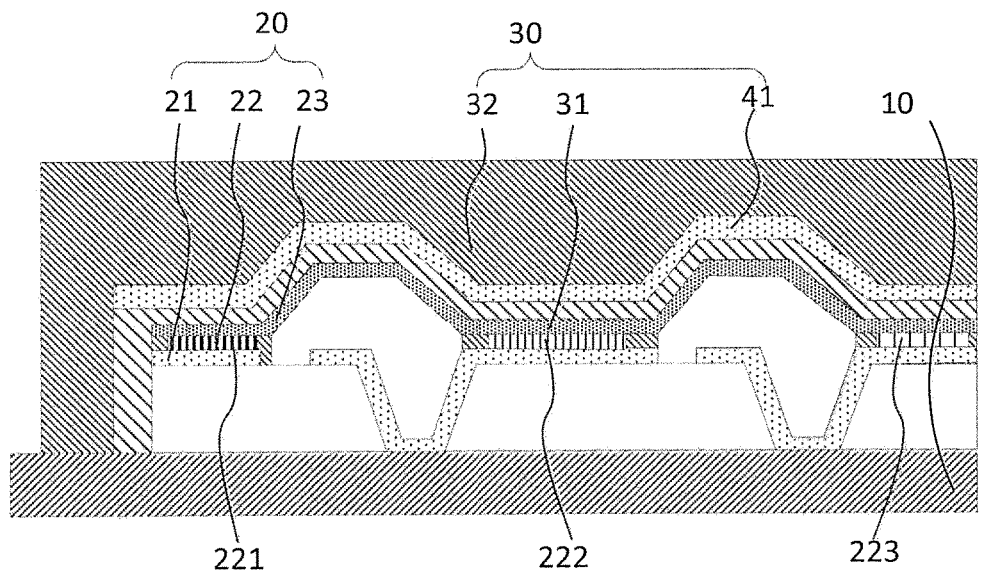
FIG. 11 illustrates a structural schematic diagram of still another organic light-emitting display panel according to an embodiment of the present disclosure.
Figure 12:
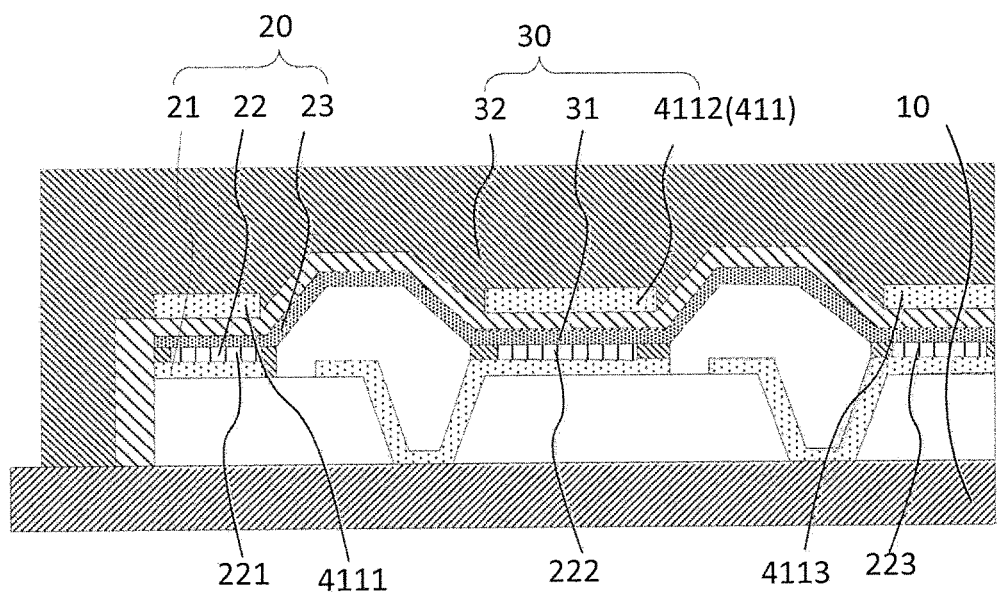
FIG. 12 illustrates a structural schematic diagram of still another organic light-emitting display panel according to an embodiment of the present disclosure.

Optionally, FIG. 11 illustrates a structural schematic diagram of still another organic light-emitting display panel according to an embodiment of the present disclosure. As shown in the embodiment shown in FIG. 11, the light-emitting pixels 22 includes a red light-emitting pixel 221, a green light-emitting pixel 222 and a blue light-emitting pixel 223. The refractive index of the first interlayer bonding layer 41 corresponding to the red light-emitting pixel is n5, the refractive index of the first interlayer bonding layer 41 corresponding to the green light-emitting pixel 222 is n6, the refractive index of the first interlayer bonding layer corresponding to the blue light-emitting pixel is n7, and n5≥n6>n7. Optionally, FIG. 12 illustrates a structural schematic diagram of still another organic light-emitting display panel according to an embodiment of the present disclosure. As shown in FIG. 12, the first interlayer bonding layer includes a plurality of island-shaped first interlayer bonding sub-layers 411, and the island-shaped first interlayer bonding sub-layers 411 are placed corresponding to the light-emitting pixels 22. The light-emitting pixels 22 include a red light-emitting pixel 221, a green light-emitting pixel 222 and a blue light-emitting pixel 223. The refractive index of the first interlayer bonding sub-layer 4111 corresponding to the red light-emitting pixel 221 is n5, the refractive index of the first interlayer bonding sub-layer 4112 corresponding to the green light-emitting pixel 222 is n6, and the refractive index of the first interlayer bonding sub-layer 4113 corresponding to the blue light-emitting pixel 223 is n7. The existing organic light-emitting display panel will display a bluish color when viewed at a high view angle, and the bluish color will be displayed especially in the bending area when the display panel is bent. Because of the micro-cavity structure of the organic light-emitting element, a blue shift in the spectrum occurs at a big view angle. Therefore, it's necessary to supplement more red lights when at the high view angle to maintain white balance. When at a high angle, the blue light shows the highest brightness and the red light shows the lowest brightness, so that the organic light-emitting display panel will display a bluish color at a high view angle. In the present embodiment, the refractive index n5 of the first interlayer bonding sub-layer 4111 corresponding to the red light-emitting pixel 221 is greater than or equal to the refractive index n6 of the first interlayer bonding sub-layer 4112 corresponding to the green light-emitting pixel 222, and both n5 and n6 are greater than the refractive index n7 of the first interlayer bonding sub-layer 4113 corresponding to the blue light-emitting pixel 223, which improves the light output efficiency of the red light-emitting pixel 221 and increases the brightness of the red light, thereby eliminating the bluish display phenomenon at a high view angle and also eliminating the bluish display phenomenon in the bending area when bending.

Figure 13:
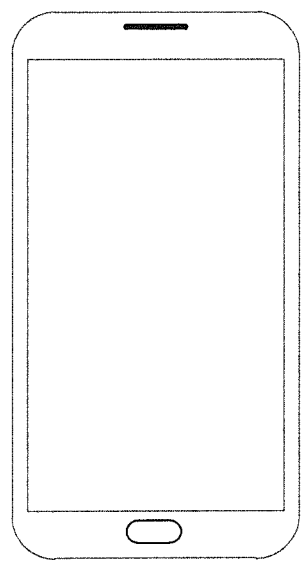
FIG. 13 illustrates a structural schematic diagram of an organic light-emitting display device according to an embodiment of the present disclosure.

The present disclosure further provides an organic light-emitting display device. FIG. 13 illustrates a structural schematic diagram of an organic light-emitting display device according to an embodiment of the present disclosure. As shown in FIG. 13, the organic light-emitting display device includes the organic light-emitting display panel as described in any embodiment above, and can be a cell phone, a tablet computer or a wearable device, etc. It can be understand that the organic light-emitting display device may further include a component such as a driving chip and the like that are already known in the art, which is not repeated herein.

The above are detailed description of the present disclosure with reference to the optional embodiments of the present disclosure. However, those specific embodiments should not be limited to the description herein. Those skilled in the art can further make various derivations and replacements to the present disclosure without departing from the invention concept of the present disclosure. All the derivations and replacements shall fall into the protection scope of the present disclosure, and the protection scope of the present disclosure shall be defined by the claims

What is claimed is:

1. An organic light-emitting display panel, comprising:
   an array substrate;
   an organic light-emitting element placed on the array substrate and comprising a plurality of light-emitting pixels; and
   an encapsulation layer placed on a side of the organic light-emitting element away from the array substrate, wherein the encapsulation layer comprises, along a direction away from the array substrate, a first inorganic encapsulation layer, a first interlayer bonding layer and a first organic encapsulation layer;
   wherein a refractive index of the first inorganic encapsulation layer is n1, a refractive index of the first interlayer bonding layer is n2, a refractive index of the first organic encapsulation layer is n3, wherein the refractive index n2 of the first interlayer bonding layer decreases in gradient along a direction from the first inorganic encapsulation layer toward the first organic encapsulation layer, a maximum refractive index of the first interlayer bonding layer is n21, a minimum refractive index of the first interlayer bonding layer is n22, wherein n21>n1, n22<n3, and
   wherein the first inorganic encapsulation layer has a thickness of 10 nm-100 nm,
   wherein the first interlayer bonding layer comprises silicon oxynitride, and an oxygen concentration of the silicon oxynitride in the first interlayer bonding layer increases in gradient along the direction from the first inorganic encapsulation layer toward the first organic encapsulation layer;
   wherein the first interlayer bonding layer comprises a plurality of island-shaped first interlayer bonding sub-layers; and wherein the organic light-emitting display panel further comprises a second interlayer bonding layer, wherein a groove is defined in a side of the first organic encapsulation layer away from the organic light-emitting element, and the second interlayer bonding layer is filled in the groove.

2. The organic light-emitting display panel according to claim 1, wherein the first inorganic encapsulation layer comprises a material selected from a group consisting of metal oxide, non-metal oxide, nitride, oxynitride and combinations thereof.

3. The organic light-emitting display panel according to claim 2, wherein the metal oxide comprises aluminum oxide, titanium oxide or any combination thereof, and the nitride comprises silicon nitride.

4. The organic light-emitting display panel according to claim 1, wherein shapes of the island-shaped first interlayer bonding sub-layers when viewed from top comprise quadrangles, circles, triangles, polygons or any combination thereof.

5. The organic light-emitting display panel according to claim 1, wherein adjacent island-shaped first interlayer bonding sub-layers are spaced from one another.

6. The organic light-emitting display panel according to claim 1, wherein the island-shaped first interlayer bonding sub-layers are placed corresponding to the light-emitting pixels, and projections of the light-emitting pixels on the array substrate are located in projections of the island-shaped first interlayer bonding sub-layers on the array substrate.

7. The organic light-emitting display panel according to claim 1, wherein a projection of the groove on the array substrate does not overlap with projections of the island-shaped first interlayer bonding sub-layers on the array substrate.

8. The organic light-emitting display panel according to claim 1, wherein the second interlayer bonding layer is filled in the groove and covers the first organic encapsulation layer.

9. The organic light-emitting display panel according to claim 1, further comprising a second inorganic encapsulation layer covering the first organic encapsulation layer.

10. The organic light-emitting display panel according to claim 9, wherein the second interlayer bonding layer is placed between the second inorganic encapsulation layer and the first organic encapsulation layer.

11. The organic light-emitting display panel according to claim 1, wherein a refractive index of the second interlayer bonding layer is $n4$, and wherein $n4>n3$.

12. The organic light-emitting display panel according to claim 1, wherein the second interlayer bonding layer comprises silicon oxynitride, an oxygen concentration of the silicon oxynitride in the second interlayer bonding layer increases in gradient along a direction from the first inorganic encapsulation layer toward the second interlayer bonding layer.

13. The organic light-emitting display panel according to claim 12, wherein a refractive index of the second interlayer bonding layer decreases in gradient along a direction from the first inorganic encapsulation layer toward the first organic encapsulation layer, a maximum refractive index of the second interlayer bonding layer is $n41$, a minimum refractive index of the second interlayer bonding layer is $n42$, and wherein $n41>n3$.

14. The organic light-emitting display panel according to claim 1, wherein the light-emitting pixels comprise a red light-emitting pixel, a green light-emitting pixel and a blue light-emitting pixel, a refractive index of the first interlayer bonding layer corresponding to the red light-emitting pixel is $n5$, a refractive index of the first interlayer bonding layer corresponding to the green light-emitting pixel is $n6$, a refractive index of the first interlayer bonding layer corresponding to the blue light-emitting pixel is $n7$, and wherein $n5 \geq n6 > n7$.

15. The organic light-emitting display panel according to claim 14, wherein the island-shaped first interlayer bonding sub-layers are placed corresponding to the light-emitting pixels, a refractive index of the island-shaped first interlayer bonding sub-layers corresponding to the red light-emitting pixels is $n5$, a refractive index of the island-shaped first interlayer bonding sub-layers corresponding to the green light-emitting pixel is $n6$, a refractive index of the island-shaped first interlayer bonding sub-layers corresponding to the blue light-emitting pixel is $n7$.

16. An organic light-emitting display device, comprising an organic light-emitting display panel, the organic light-emitting display panel comprising:
an array substrate;
an organic light-emitting element placed on the array substrate and comprising a plurality of light-emitting pixels; and
an encapsulation layer placed on a side of the organic light-emitting element away from the array substrate, wherein the encapsulation layer comprises, along a direction away from the array substrate, a first inorganic encapsulation layer, a first interlayer bonding layer and a first organic encapsulation layer;
wherein a refractive index of the first inorganic encapsulation layer is $n1$, a refractive index of the first interlayer bonding layer is $n2$, a refractive index of the first organic encapsulation layer is $n3$, wherein the refractive index $n2$ of the first interlayer bonding layer decreases in gradient along a direction from the first inorganic encapsulation layer toward the first organic encapsulation layer, a maximum refractive index of the first interlayer bonding layer is $n21$, a minimum refractive index of the first interlayer bonding layer is $n22$, wherein $n21>n1$, $n22<n3$, and
wherein the first inorganic encapsulation layer has a thickness of 10 nm-100 nm;
wherein the first interlayer bonding layer comprises silicon oxynitride, and an oxygen concentration of the silicon oxynitride in the first interlayer bonding layer increases in gradient along the direction from the first inorganic encapsulation layer toward the first organic encapsulation layer;
wherein the first interlayer bonding layer comprises a plurality of island-shaped first interlayer bonding sub-layers; and
wherein the organic light-emitting display panel further comprises a second interlayer bonding layer, wherein a groove is defined in a side of the first organic encapsulation layer away from the organic light-emitting element, and the second interlayer bonding layer is filled in the groove.

* * * * *